United States Patent [19]
Kobatake

[11] Patent Number: 5,892,258
[45] Date of Patent: Apr. 6, 1999

[54] READ-ONLY SEMICONDUCTOR MEMORY DEVICE

[75] Inventor: Hiroyuki Kobatake, Tokyo, Japan

[73] Assignee: NEC Corporation, Tokyo, Japan

[21] Appl. No.: 892,182

[22] Filed: Jul. 14, 1997

[30] Foreign Application Priority Data

Jul. 17, 1996 [JP] Japan ................................... 8-187538

[51] Int. Cl.⁶ ............................................... H01L 29/788
[52] U.S. Cl. ........................... 257/316; 257/314; 257/315; 257/317
[58] Field of Search .................................... 257/314, 315, 257/317

[56] References Cited

U.S. PATENT DOCUMENTS

| | | | |
|---|---|---|---|
| 4,642,673 | 2/1987 | Miyamoto et al. | 357/23.5 |
| 5,094,968 | 3/1992 | Schumann et al. | 437/43 |
| 5,189,497 | 2/1993 | Komori et al. | 357/23.5 |

FOREIGN PATENT DOCUMENTS

| | | |
|---|---|---|
| 0 357 333 | 3/1990 | European Pat. Off. . |
| 0 498 642 | 8/1992 | European Pat. Off. . |
| 0 678 921 | 10/1995 | European Pat. Off. . |
| 63-157480 | 6/1988 | Japan . |
| 2-2684 | 1/1990 | Japan . |
| 7-288291 | 10/1995 | Japan . |
| 2 199 184 | 6/1988 | United Kingdom . |

*Primary Examiner*—Olik Chaudhuri
*Assistant Examiner*—Douglas A. Wille
*Attorney, Agent, or Firm*—Young & Thompson

[57] ABSTRACT

An n-type drain diffusion layer, an n-type source diffusion layer and an n-type control gate diffusion layer are formed on the surface of a p-type semiconductor substrate. Furthermore, an n-type well is connected to the control gate diffusion layer. A control gate electrode of aluminum is connected to the well. An isolation oxide layer is formed between the control gate electrode and the control gate diffusion layer. A first insulation layer is formed on the drain diffusion layer, the source diffusion layer and the control gate diffusion layer. A floating gate is formed on the first insulation layer. The upper portion and the side portion of the floating gate are covered with a second insulation layer. The floating gate is completely covered with a protective gate through the second insulation layer. The end edge of the protective gate opposes the well through the isolation oxide layer. The drain diffusion layer and the protective gate are connected to each other to have the same potential.

11 Claims, 10 Drawing Sheets

READ-ONLY SEMICONDUCTOR MEMORY DEVICE

BACKGROUND OF THE INVENTION

1. Field of the Invention

The present invention relates to a read-only semiconductor memory device to be used as a memory device of a computer or the like. More specifically, the invention relates to a nonvolatile read-only semiconductor memory device having a floating gate, whose surface is not covered with a control gate.

2. Description of the Prior Art

Conventionally, there is a structure for a nonvolatile semiconductor device, in which two layers of gates, i.e. a floating gate and a control gate, are provided. However, such semiconductor device requires large number of fabrication process for formation of two layers of gates. Therefore, there has been proposed a nonvolatile semiconductor memory device which has a structure with only one layer of gate (Japanese Unexamined Patent Publication No. Hei 7-288291). FIG. 1A is a diagrammatic plan view of a conventional semiconductor memory device disclosed in Japanese Unexamined Patent Publication No. Hei 7-288291, and FIG. 1B is a section taken along line A—A in FIG. 1A. It should be noted that an interlayer insulation layer and an isolation oxide layer are neglected from illustration in FIG. 1A. In the shown semiconductor memory device, an n-type drain diffusion layer 111, an n-type source diffusion layer 112 and an n-type control gate diffusion layer are stacked on the surface of a p-type semiconductor substrate 110 of single crystalline silicon. Also, a p-type channel region 125 is formed between the drain diffusion layer 111 and source diffusion layer 112. An isolation oxide layer 117 is formed between the respective diffusion layers except for the channel region 125. A tunnel insulation layer 119a covering a part of the drain diffusion layer 111, a part of the source diffusion layer 112 and the channel region 125 and a tunnel insulation layer 119b covering a part of the control gate diffusion layer 114 are formed. The tunnel insulation layers 119a and 119b are integrated with each other. Also, a floating gate 113 of polycrystalline silicon is formed on the tunnel insulation layers 119a and 119b.

Also, a protective layer 118 of polycrystalline silicon is formed via an insulation layer 120 above a part of the floating gate 113. Then, the respective elements formed on or above the surface of the p-type semiconductor substrate 110 are covered with an interlayer insulation layer 126. Also, contact holes 121 to 124 are provided through the interlayer insulation later 126. Then, the drain diffusion layer 111 is connected to a drain electrode 211 of aluminum via the contact hole 121. The source diffusion layer 112 is connected to a source electrode 212 of aluminum via the contact hole 122. Also, the control gate diffusion layer 114 is connected to a control gate electrode 214 of aluminum via the contact hole 123. The protective layer 118 is connected to a protective gate electrode 218 of aluminum via the contact hole 124. The protective gate electrode 218 and the drain electrode 211 are connected to each other.

Next, operation of the foregoing semiconductor device will be discussed. FIG. 2 is a diagrammatic illustration showing an equivalent circuit of the memory cell. Some parasitic capacitance is present between the floating gate 113 and the drain diffusion layer 111, between the floating gate 113 and the source diffusion layer 112, between the floating gate 113 and the p-type semiconductor substrate 110 and between the floating gate 113 and the control gate diffusion layer 114, respectively. Each parasitic capacitance is respectively assumed as $C_{FD}$, $C_{FS}$, $C_{FB}$ and $C_{CF}$ in sequential order. Also, a large parasitic capacitance is present between the floating gate 113 and the protective gate 118. Since the protective gate 118 is connected to the drain electrode 211, this parasitic capacitance is included in $C_{FD}$. At this time, an expression of $C_{FD} \gg C_{FS}$, $C_{FB}$ and $C_{CF}$ exists.

The following table 1 shows potential to be applied to the memory cell upon writing or erasing.

TABLE 1

|  | DRAIN | SOURCE | CONTROL GATE |
| --- | --- | --- | --- |
| WRITING | GROUND | — | $V_{PP}$ |
| ERASING | $V_{PP}$ | — | GROUND |

Upon writing, as shown in the foregoing table 1, the drain electrode 211 is biased to the grounding potential, the control gate electrode 214 is biased to high potential $V_{PP}$ for programming, and no potential is applied to the source electrode 212. At this time, since the expression of $C_{FD} \gg C_{FS}$, $C_{FB}$ and $C_{CF}$ exists, the potential of the floating gate 113 is biased substantially to the grounding potential as the same potential as the drain diffusion layer 111. Therefore, a potential difference between the floating gate 113 and the control gate diffusion layer 114 becomes substantially equal to $V_{PP}$ to cause movement of electron from the floating gate 113 to the control gate diffusion layer 114 by tunnel effect. Thus, the threshold voltage (hereinafter referred to as $V_{tm}$) of the memory cell is shifted to low voltage to memorize "1", for example.

On the other hand, upon erasing, as shown in the table 1, the drain electrode 211 is biased to the high potential $V_{PP}$, the control gate electrode 214 is biased to the grounding potential. Then, no potential is applied to the source electrode 212. At this time, since the expression of $C_{FD} \gg C_{FS}$, $C_{CB}$ and $C_{CF}$ exists, the potential of the floating gate 113 is biased substantially to $V_{PP}$. On the other hand, the control gate electrode 214 is biased to the grounding potential. Therefore, the potential difference between the floating gate 113 and the control gate diffusion layer 114 becomes substantially equal to $V_{PP}$ to cause movement of electron from the control gate diffusion layer 114 to the floating gate 113 conversely to the case of writing by the tunnel effect. Therefore, the threshold voltage $V_{tm}$ is shifted to high voltage to memorize "0", for example.

However, since the floating gate 113 is not completely covered with the protective gate 118 in such a semiconductor memory device, if a quite large amount of mobile ion, such as Na ion or the like, penetrates into the chip, some mobile ion may reach the floating gate 113. Therefore, electron stored up in the floating gate 113 is electrically neutralized to destroy the memorized data.

When a structure to completely cover the floating gate 113 with a protective layer is taken in order to prevent the mobile ion from penetrating, another problem should be encountered. For example, when the floating gate 113 is completely covered with the protective gate 118a and 118b as shown with chain lines in FIGS. 1A and 1B, if the insulation layer 120 is formed thinner, coupling capacitance between the protective gate 118, 118a and 180b and the floating gate 113 becomes larger. At this time, since the drain electrode 211 and the protective gate electrode 218 are connected to each other, the potential of the drain diffusion layer 111 and the potential of the floating gate 113 become substantially equal to each other. Thus, it appears that the potential difference between the control gate diffusion layer 114 and the floating gate 113 becomes closer to $V_{PP}$ upon writing and erasing to improve efficiency of writing and erasing. However, since the protective gate 118b and the control gate diffusion layer 114 are located adjacently, transfer of electron is caused even between the protective gate 118b and the control gate diffusion layer 114 by the tunnel effect. This transfer of electron does not contribute for writing and erasing, and the efficiency of writing and erasing is lowered practically.

On the other hand, when the insulation layer 120 is formed thicker, the coupling capacitance between the protective gates 118, 118a and 180b and the floating gate 113 becomes smaller. Therefore, the potential difference between the floating gate 113 and the control gate diffusion layer 114 becomes smaller than $V_{PP}$ to lower the efficiency of writing and erasing.

On the other hand, there has been proposed a nonvolatile semiconductor memory device, in which the tunnel effect between the protective gate and the control diffusion layer is prevented (Japanese Unexamined Patent Publication No. Hei 2-2684). FIG. 3A is a diagrammatic plan view of a conventional semiconductor memory device disclosed in the foregoing publication, and FIG. 3B is a section taken along line B—B in FIG. 3A. It should be noted that the interlayer insulation layer and the isolation oxide layer are ommitted from FIG. 3A. In the shown semiconductor memory device, an n-type drain diffusion layer 131, an n-type source diffusion layer 132 and an n-type control gate diffusion layer 134 are stacked on the surface of the p-type semiconductor substrate 130. Also, a p-type channel region 145 is formed between the drain diffusion layer 131 and the source diffusion layer 132. An isolation oxide layer 137 is formed between the respective diffusion layers except for the channel region 145. A tunnel insulation layer 139a covering a part of the drain diffusion layer 131, a part of the source diffusion layer 132 and the channel region 145 and a tunnel insulation layer 139b covering the control gate diffusion layer 134 and a part of the isolation layer 137 formed on both sides of the control gate diffusion layer 134 are formed. The tunnel insulation layers 139a and 139b are integrated with each other. Also, a floating gate 133 of polycrystalline silicon is formed on the tunnel insulation layers 139a and 139b. A distance between the floating gate 133 and a portion of the drain diffusion layer 131 is narrower than a distance between the floating gate 133 and the source diffusion layer 132.

Also, the floating gate 133 is completely covered with a protective gate 138 of polycrystalline silicon via an insulation layer 140. The respective elements formed on or above the surface of the p-type semiconductor substrate 130 are covered with the interlayer insulation layer 146. Contact holes 141, 142 and 144 are provided through the interlayer insulation layer 146. The drain diffusion layer 131 is connected to a drain electrode 231 of aluminum via the contact hole 141, and the source diffusion layer 132 is connected to a source electrode 232 of aluminum via the contact hole 142. Also, the protective gate 138 is connected to a protective gate electrode 238 of aluminum via the contact hole 144. Then, the control gate diffusion layer 134 per se serves as the electrode 234 for the control gate.

Next, operation of the foregoing semiconductor device will be discussed. FIG. 4 is a diagrammatic illustration of an equivalent circuit of the memory cell. Some parasitic capacitance is present between the floating gate 133 and the drain diffusion layer 131, between the floating gate and the source diffusion layer 132, between the floating gate 133 and the p-type semiconductor substrate 130, between the floating gate 133 and the control gate diffusion layer 134 and between the floating gate 133 and the protective gate 138, respectively. Each parasitic capacitance is respectively assumed as $C_{FD}$, $C_{FS}$, $C_{FB}$, $C_{CF}$ and $C_{FG}$ in sequential order. At this time an expression of $C_{CF} \gg C_{FD}$, $C_{FS}$, $C_{FB}$ and $C_{FG}$ exists.

The following table 2 shows potential to be applied to the memory cell upon writing or erasing.

TABLE 2

|  | DRAIN | SOURCE | CONTROL GATE |
|---|---|---|---|
| WRITING | $V_{PP}$ | — | GROUND |
| ERASING | GROUND | — | $V_{PP}$ |

Upon writing, as shown in the foregoing table 2, the drain electrode 231 is biased to high potential $V_{PP}$ for programming, and the control gate 234 is biased to the grounding potential. Then, no potential is applied to the source electrode 232. At this time, the potential $V_{FGw}$ of the floating gate 133 upon writing is expressed as the following equation (1):

$$V_{FGw} = (C_{FD}/(C_{FD}+C_{FS}+C_{FB}+C_{FG}+C_{CF})) \times V_{PP} \quad (1)$$

Then, since the expression of $C_{CF} \gg C_{FD}$, $C_{FS}$, $C_{FB}$ and $C_{FG}$ exists, upon writing, $V_{FGw}$ becomes substantially equal to 0 V. Therefore, a potential difference between the floating gate 133 and the drain diffusion layer 131 becomes substantially equal to $V_{PP}$ to cause movement of electron from the floating gate 133 to the drain diffusion layer 131 by the tunnel effect. Thus, the threshold voltage $V_{tm}$ is shifted to low voltage to memorize "1", for example.

On the other hand, upon erasing, as shown in the foregoing table 2, the drain electrode 231 is biased to the grounding potential, and the control gate electrode 243 is biased to the high potential $V_{PP}$ for programming. Then, no potential is applied to the source electrode 232. At this time, the potential $V_{FGe}$ of floating gate 133 upon erasing is expressed as the following equation (2):

$$V_{FGe} = (C_{CF}/(C_{FD}+C_{FS}+C_{FB}+C_{FG}+C_{CF})) \times V_{PP} \quad (2)$$

Then, the expression of $C_{CF} \gg C_{FD}$, $C_{FS}$, $C_{FB}$ and $C_{FG}$ exists, upon erasing, $V_{FGe}$ becomes substantially equal to $V_{PP}$. Therefore, a potential difference between the floating gate 133 and the drain diffusion layer 131 becomes close to $V_{PP}$. Conversely to the case of writing, electron moves from the drain diffusion layer 131 to the floating gate 133. Thus, the threshold voltage $V_{tm}$ is shifted to high voltage to memorize "0", for example.

However, in the shown semiconductor device, the protective gate 138 is biased to the grounding potential and parasitic capacitance $C_{FG}$ is present. Therefore, upon erasing, the potential of the floating gate 133 becomes much lower than $V_{PP}$ to lower the efficiency of erasing.

On the other hand, there has also been proposed a nonvolatile semiconductor device having a non-transparent material, such as aluminum, in order to avoid influence of light to a charge stored up in a floating gate (Japanese Unexamined Patent Publication No. Sho 63-157480). FIG. 5A is a diagrammatic plan view of a conventional semiconductor memory device disclosed in the foregoing publication, and FIG. 5B is a section taken along line C—C in FIG. 5A. It should be noted that the interlayer insulation layer and the isolation oxide layer are neglected from illustration in FIG. 5A. In the shown semiconductor memory device, an n-type drain diffusion layer 151, an n-type source diffusion layer 152 and mutually adjacent an n-type control gate diffusion layer 154 and a p-type control gate diffusion layer 155 are stacked on the surface of the p-type semiconductor substrate 150. Also, a p-type channel region 165 is formed between the drain diffusion layer 151 and the source diffusion layer 152. Also, a p-type diffusion layer 158 surrounding the foregoing elements is formed. An n-type diffusion layer 157*a* is formed outside of the p-type diffusion layer 158 with respect to the drain diffusion layer 151. An n-type diffusion layer 157*b* is formed outside of the p-type diffusion layer 158 with respect to the source diffusion layer 152. An n-type diffusion layer 157*c* is formed outside of the p-type diffusion layer 158 with respect to the control gate diffusion layers 154 and 155. Also, an isolation oxide layer 159 is formed between the respective diffusion layers except for the channel region 165. Then, a tunnel insulation layer 160 covering a part of the drain diffusion layer 151, a part of the source diffusion layer 152 and a part of the control gate diffusion layers 154 and 155 is formed. Furthermore, a floating gate 153 formed of polycrystalline silicon is provided on the tunnel insulation layer 160.

Also, the respective elements formed on or above the surface of the p-type semiconductor substrate 150 are covered with an interlayer insulation layer 166. Contact holes 161 to 164 reaching the n-type diffusion layers 157*a*, 157*b* or 157*c* or the p-type diffusion layer 158 are provided through the interlayer insulation layer 166. Furthermore, an n-type well 156*a* extending from the n-type diffusion layer 157*a* to the drain diffusion layer 151 through a portion of the p-type semiconductor substrate 150 is formed. An n-type well 156*b* extending from the n-type diffusion layer 157*b* to the source diffusion layer 152 through a portion of the p-type semiconductor substrate 150 is formed. An n-type well 156*c* extending from the n-type diffusion layer 157*c* to the control gate diffusion layers 154 and 155 through a portion of the p-type semiconductor substrate 150 and completely surrounding the control gate diffusion layers 154 and 155 is formed. The drain diffusion layer 151 is connected to a drain electrode 251 via the n-type well 156*a*, the n-type diffusion layer 157*a* and the contact hole 161. The source diffusion layer 152 is connected to a source electrode 252 via the n-type well 156*b*, the n-type diffusion layer 157*b* and the contact hole 162. Also, the control gate diffusion layers 154 and 155 are connected to a control gate electrode 254 via the n-type well 156*c*, the n-type diffusion layer 157*c* and the contact hole 163.

Then, a non-transparent material 170, such as aluminum or the like, is buried in the contact hole 164 reaching the p-type diffusion layer 158. Also, the non-transparent material 170 is stacked on the upper surface of the interlayer insulation layer 166 surrounded by the contact hole 164 to be integrated with the non-transparent material 170 buried in the contact hole 164.

Next, operation of the foregoing semiconductor device will be discussed. The following table 3 shows potential to be applied to the memory cell upon writing.

TABLE 3

|  | DRAIN | SOURCE | CONTROL GATE |
|---|---|---|---|
| WRITING | HV | GROUND | $V_{PP}$ |

Upon writing, as shown in the foregoing table 3, the drain electrode 251 is biased to high potential HV for programming, the source electrode is biased to the grounding potential and the control gate electrode 254 is biased to $V_{PP}$. For example, HV is equal to 6V and $V_{PP}$ is equal to 12.5V. At this time, a current flows from the drain electrode 251 to the source electrode 252 to induce hot electron in the vicinity of the drain diffusion layer 151. The hot electron is injected into the floating gate 153 to shift the threshold voltage $V_{tm}$ to high voltage to memorize "0", for example.

On the other hand, upon erasing, irradiating ultraviolet ray to the memory cell is performed, and whereby electron stored up in the floating gate 153 is eliminated. However, since the semiconductor device is covered with the non-transparent material 170, erasing cannot be performed in the shown structure.

In this semiconductor device, the non-transparent material 170 is connected to the semiconductor substrate 150 via the p-type diffusion layer 158 and the n-type diffusion layers 156*a*, 156*b* and 156*c*. Since the semiconductor substrate 150 is biased to the grounding potential, the non-transparent material 170 is also connected to the grounding potential. Thus, parasitic capacitance is present between the non-transparent material 170 and the floating gate 153 to lower the potential of the floating gate 153 upon writing. Therefore, writing efficiency may be lowered.

SUMMARY OF THE INVENTION

It is an object of the present invention to provide read-only semiconductor memory device, particularly a nonvolatile semiconductor memory device, in which even when a quite large amount of mobile ion penetrates into the chip, memorized data may not be destroyed, and lowering of the efficiency in writing and erasing can be restricted.

A read-only semiconductor memory device, according to the present invention, has a first conductivity type semiconductor substrate. A second conductivity type drain diffusion layer, a second conductivity type source diffusion layer and a second conductivity type control gate diffusion layer are selectively formed on the surface of the semiconductor substrate. Also, a second conductivity type well is connected to a second conductivity diffusion layer selected from a group consisted of the drain diffusion layer, the source diffusion layer and the control gate diffusion layer. An electrode is connected to the well. An isolation region is formed between the electrode and the second conductivity type diffusion layer connected to the well. A floating gate is formed above the drain diffusion layer, the source diffusion layer and the control gate diffusion layer. A first insulation layer insulating the floating gate from the drain diffusion layer, the source diffusion layer and the control gate diffusion layer is formed. A protective gate covers the floating gate. A second insulation layer isolating the floating gate from the protective gate is formed. The end edge of the protective gate is in opposition to the well via the isolation region.

According to the present invention, the floating gate is completely covered with the protective gate. Therefore, even when a quite large amount of mobile ion penetrates into the chip, the mobile ion may not reach the floating gate to prevent memorized data from being destroyed.

Since the end edge of the protective gate is in opposition to the well connected to a second conductivity type diffusion layers selected from the drain diffusion region, the source diffusion layer and the control gate diffusion layer via the isolation region. Therefore, even when the insulation layer between the protective gate and the floating gate is made thinner and a coupling capacitance between the protective gate and the floating gate is made larger to apply high voltage to the first insulation layer in order to improve efficiency of writing and erasing, a current between the protective gate and the drain diffusion layer, the source diffusion layer or the control gate diffusion layer by the tunnel effect can be prevented from flowing. Thus, the efficiency of writing and erasing may be kept high.

On the other hand, the protective gate and the control gate diffusion layer may be connected to each other to have the same potential.

Also, the protective gate and a second conductivity type diffusion layer selected from a group consisted of the drain diffusion layer and the source diffusion layer may be connected to each other to have the same potential.

The protective gate and/or the control gate diffusion layer may be in common with at least one memory cell formed in a common memory cell array.

When the control gate diffusion layer and/or the protective gate are in common with at least one memory cell in a common memory cell array, regions to isolate the control gate diffusion layers and/or the protective gates in adjacent memory cells become unnecessary.

A distance between the floating gate and a portion of the drain diffusion layer may be narrower than a distance between the floating gate and the source diffusion layer.

Also, the well and the electrode may be connected to each other via a second conductivity type impurity diffusion layer.

The protective gate and/or the floating gate may be of polycrystalline silicon.

On the other hand, the electrode may be of aluminum.

Furthermore, the isolation region may be of silicon oxide.

The semiconductor substrate may be of silicon.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessarily obscuring the present invention.

Figure 1A:
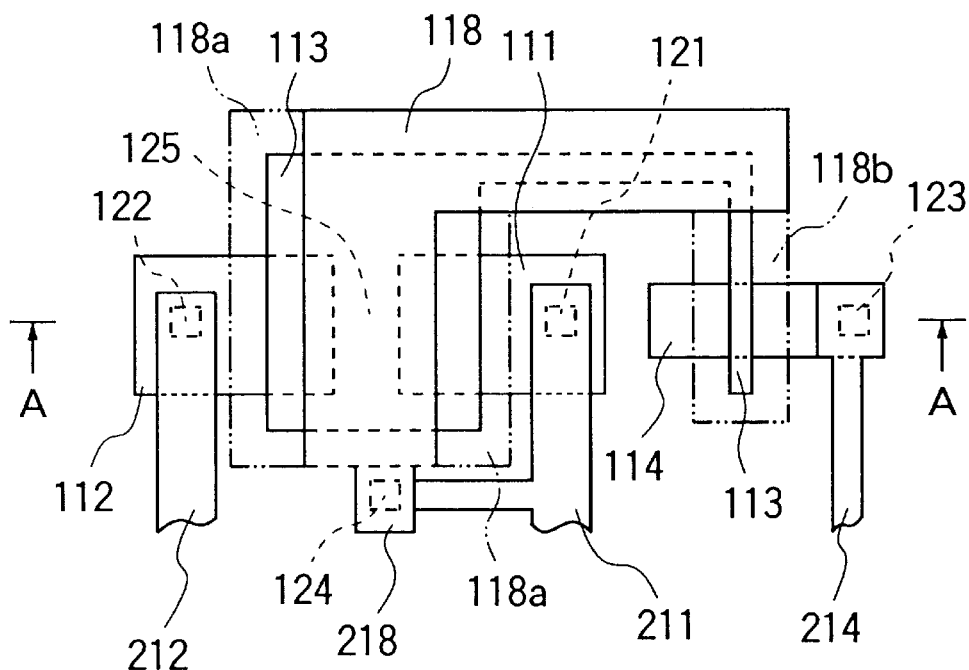
FIG. 1A is a diagrammatic plan view of a conventional semiconductor memory device disclosed in Japanese Unexamined Patent Publication No. Hei 7-288291.
Figure 1B:
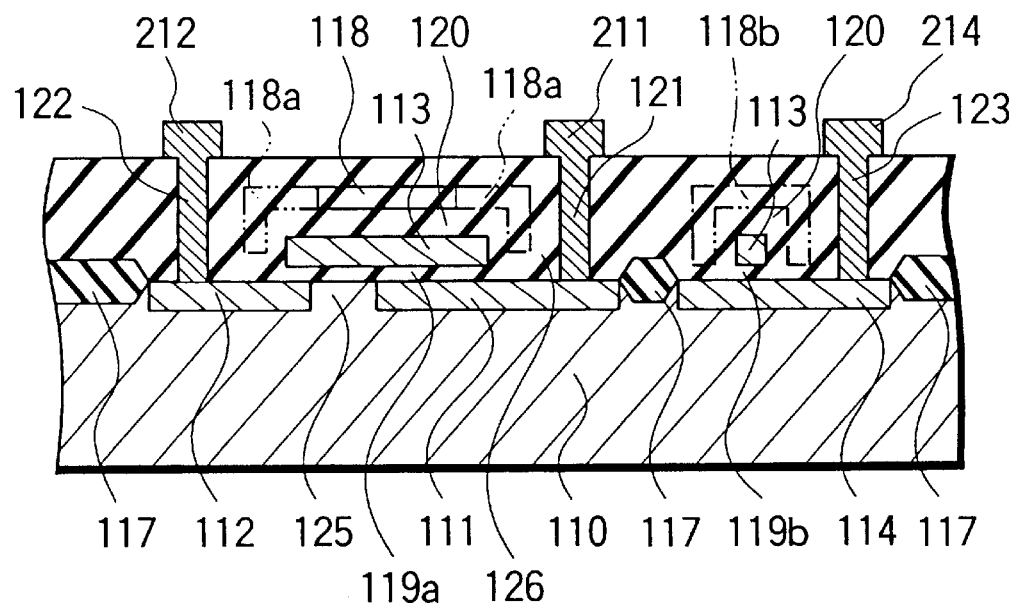
FIG. 1B is a section taken along line A—A in FIG. 1A.
Figure 2:
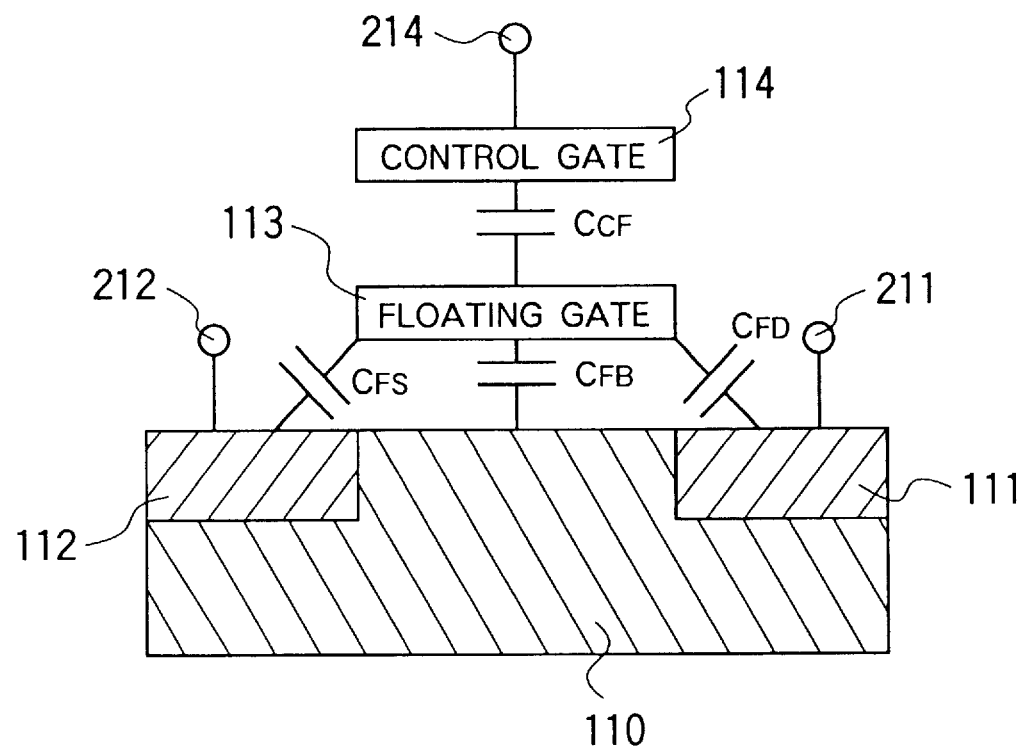
FIG. 2 is a diagrammatic illustration showing an equivalent circuit of the memory cell.
Figure 3A:
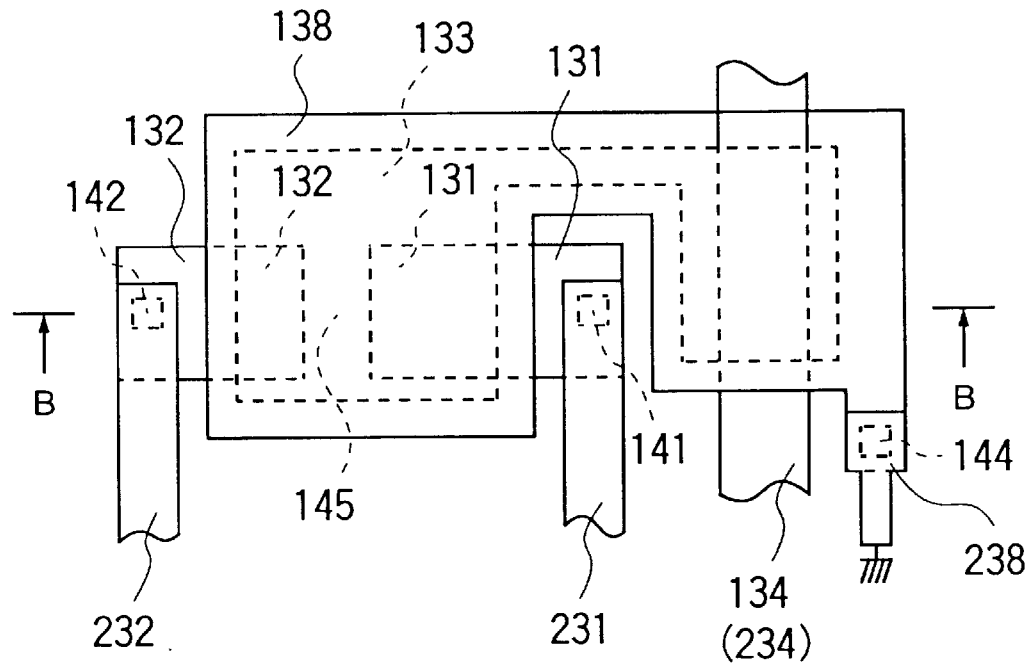
FIG. 3A is a diagrammatic plan view of a conventional semiconductor memory device disclosed in Japanese Unexamined Patent Publication No. Hei 2-2684.
Figure 3B:
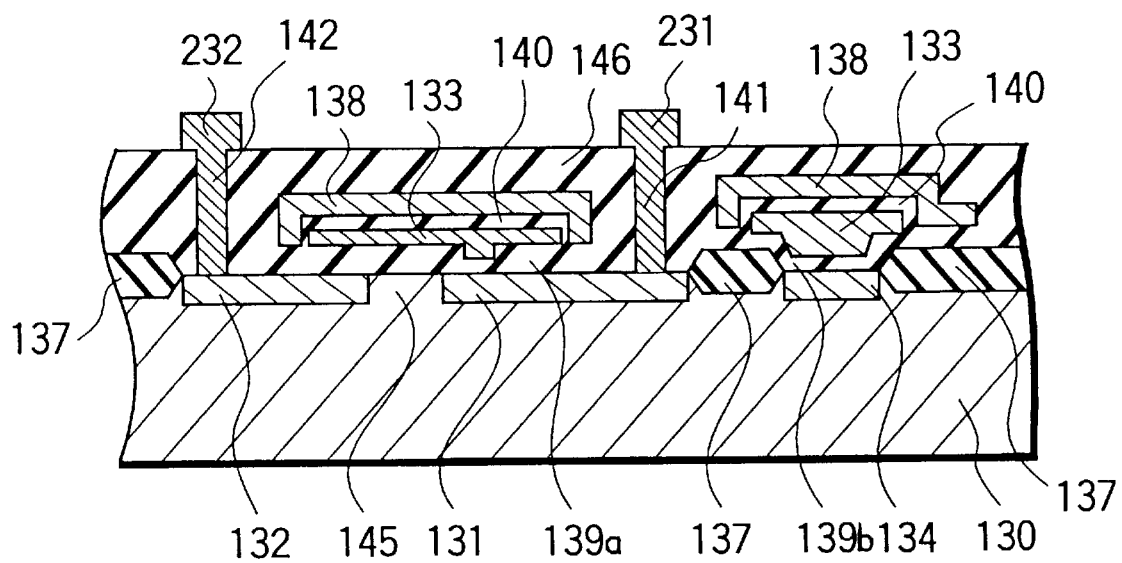
FIG. 3B is a section taken along line B—B in FIG. 3A.
Figure 4:
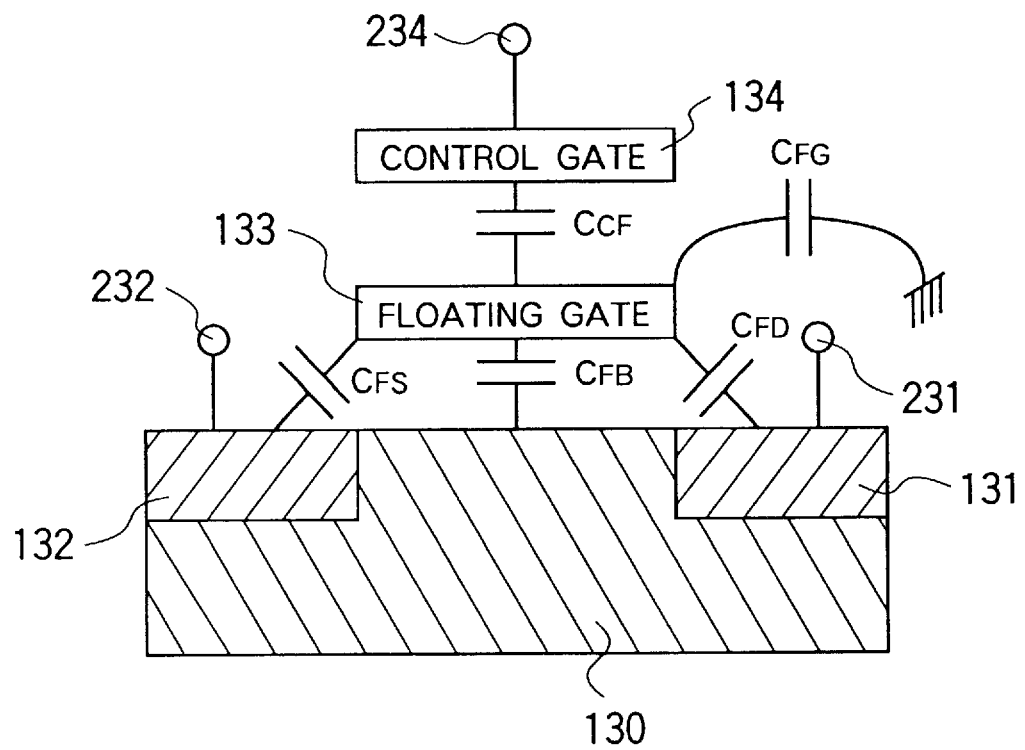
FIG. 4 is a diagrammatic illustration showing an equivalent circuit of the memory cell.
Figure 5A:
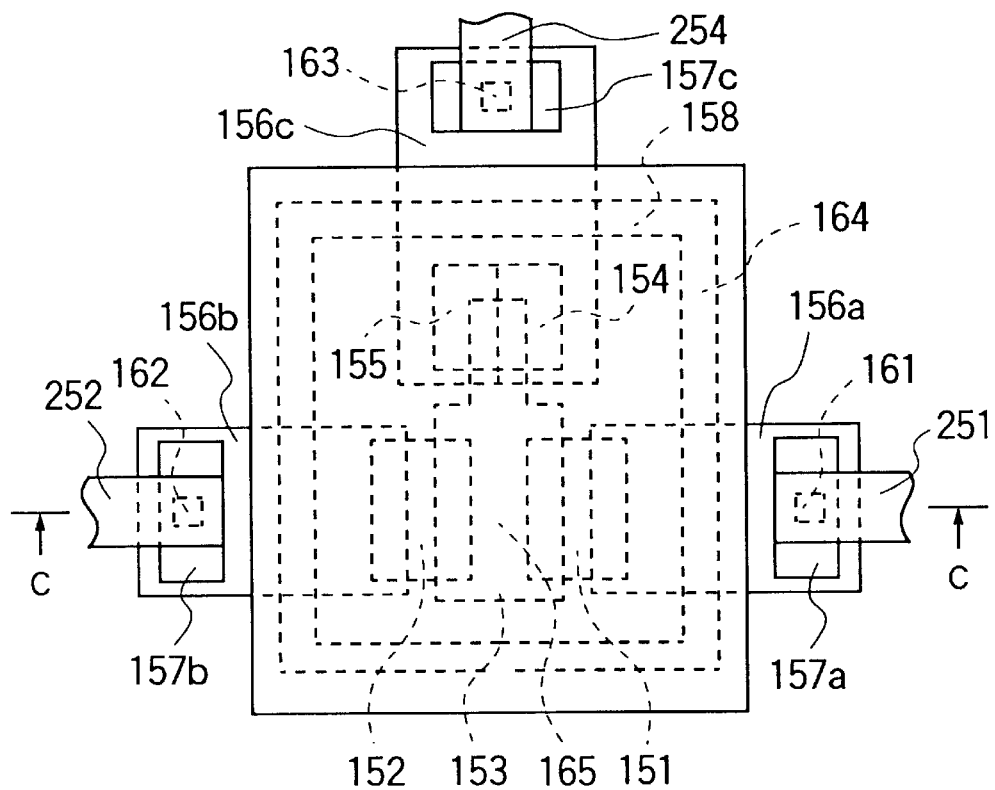
FIG. 5A is a diagrammatic plan view of a conventional semiconductor memory device disclosed in Japanese Unexamined Patent Publication No. Sho 63-157480.
Figure 5B:
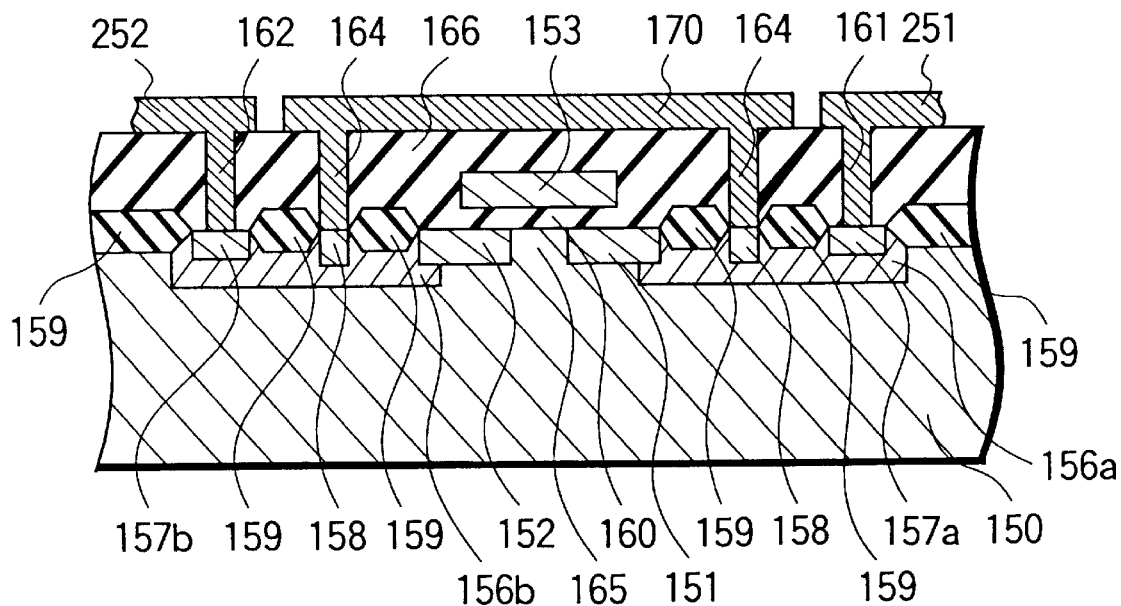
FIG. 5B is a section taken along line C—C in FIG. 5A.
Figure 6A:
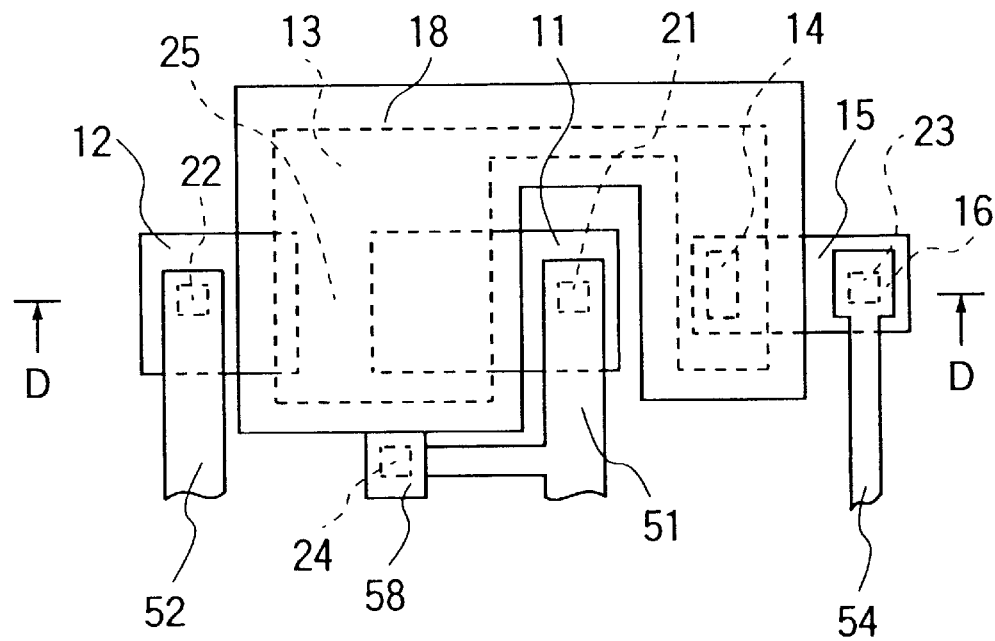
FIG. 6A is a plan view of the first embodiment of a read-only semiconductor memory device according to the present invention.
Figure 6B:
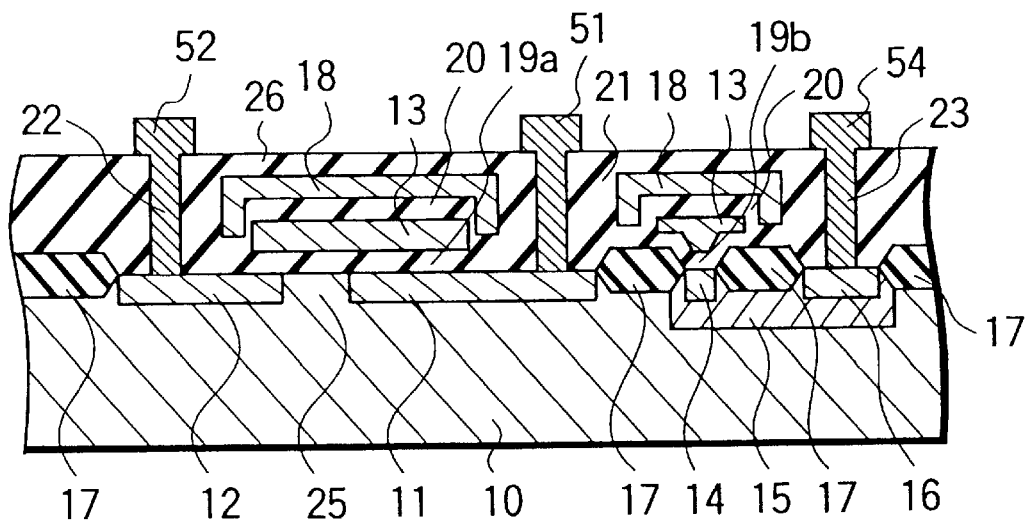
FIG. 6B is a section taken along line D—D in FIG. 6A.

FIG. 6A is a plan view of the first embodiment of a read-only semiconductor memory device according to the present invention, and FIG. 6B is a section taken along line D—D in FIG. 6A. It should be noted that an interlayer insulation layer and isolation oxide layer are neglected from illustration in FIG. 6A. In the shown embodiment, an n-type source diffusion layer 12, an n-type drain diffusion layer 11, an n-type control gate diffusion layer 14 and an n-type diffusion layer 16 are stacked in alignment in sequential order on the surface of a p-type semiconductor substrate 10. A silicon substrate, for example, may be used as the semiconductor substrate 10. Also, a p-type channel region 25 is formed between the drain diffusion layer 11 and the source diffusion layer 12. An isolation oxide layer 17 is formed between the respective elements except for the channel region 25. A tunnel insulation layer 19a covering a part of the drain diffusion layer 11, a part of the source diffusion layer 12 and the channel region 25 and a tunnel insulation layer 19b covering the control gate diffusion layer 14 and a part of the isolation oxide layer 17 adjacent thereto are formed. Also, the tunnel insulation layers 19a and 19b are integrated with each other. Furthermore, a floating gate 13 is formed on the tunnel insulation layers 19a and 19b. The floating gate 13 is formed of polycrystalline silicon, for example.

The upper portion and the side portion of the floating gate 13 are covered with an insulation layer 20. Then, the floating gate 13 is completely covered with a protective gate 18 of polycrystalline silicon via the insulation layer 20. Also, the respective elements formed on or above the surface of the semiconductor substrate 10 are covered with the interlayer insulation layer 26. Contact holes 21 to 24 respectively reaching the drain diffusion layer 11, the source diffusion layer 12, the n-type diffusion layer 16 or the protective gate 18 are provided through the interlayer insulation layer 26. Furthermore, an n-type well 15 extending from the n-type diffusion layer 16 to the control gate diffusion layer 14 through a portion of the semiconductor substrate 10 is formed. The drain diffusion layer 11 is connected to a drain electrode 51 of aluminum via the contact hole 21. The source diffusion layer 12 is connected to a source electrode 52 of aluminum via the contact hole 22. The control gate diffusion layer 14 is connected to a control gate electrode 54 of aluminum via the n-type well 15, the n-type diffusion layer 16 and the contact hole 23. The protective gate 18 is connected to the protective gate electrode 58 via the contact hole 58. The drain electrode 51 and the protective gate electrode 58 are connected to each other.

In the shown embodiment, the protective gate 18 encloses the floating gate 13, and the end edge of the protective gate 18 opposes to the n-type well 15 via a part of the interlayer insulation layer 26 and the isolation oxide layer 17.

Figure 7:
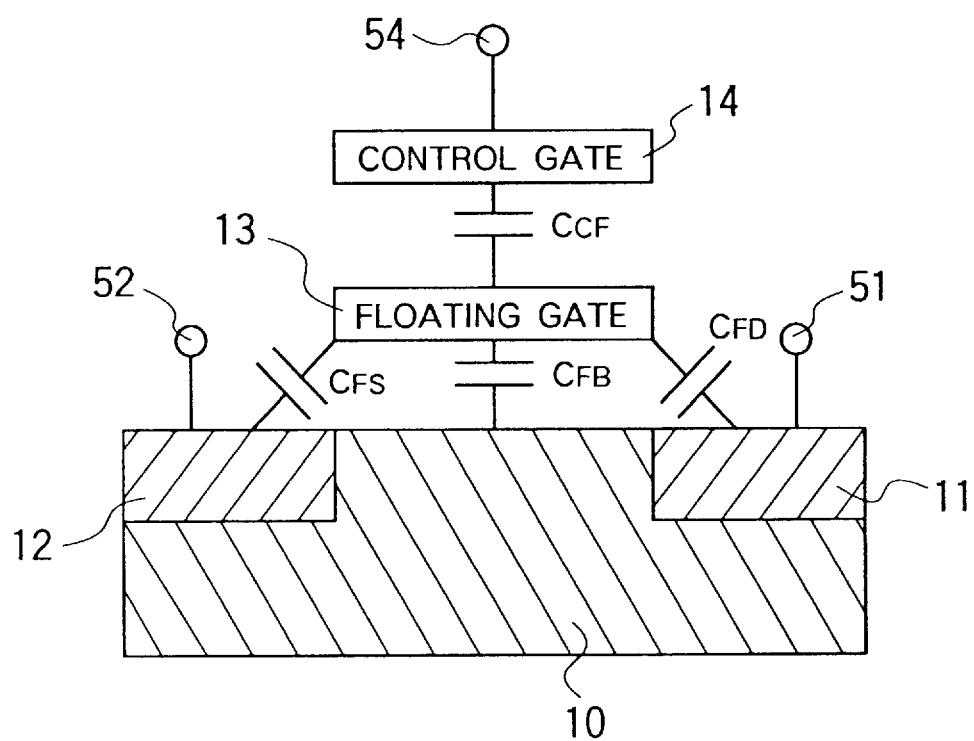
FIG. 7 is a diagrammatic illustration showing an equivalent circuit of the memory cell.

Next, the operation of the foregoing semiconductor device set forth above will be discussed. FIG. 7 is an equivalent circuit of the memory cell. Some parasitic capacitance is present between the floating gate 13 and the drain diffusion layer 11, between the floating gate 13 and the source diffusion layer 12, between the floating gate 13 and the semiconductor substrate 10 and between the floating gate 13 and the control gate diffusion layer 14, respectively. Each parasitic capacitance is respectively assumed as $C_{FD}$, $C_{FS}$, $C_{FB}$ and $C_{CF}$ in sequential order. Also, a large parasitic capacitance is present between the floating gate 13 and the protective gate 18. Since the protective gate electrode 18 is connected to the drain electrode 51, it is included in $C_{FD}$. At this time, an expression of $C_{FD} \gg C_{FS}$, $C_{FB}$ and $C_{CF}$ exists.

The following table 4 shows potential to be applied to the memory cell upon writing or erasing.

TABLE 4

|  | DRAIN | SOURCE | CONTROL GATE |
| --- | --- | --- | --- |
| WRITING | GROUND | — | $V_{PP}$ |
| ERASING | $V_{PP}$ | — | GROUND |

Upon writing, as shown in foregoing table 4, the drain electrode 51 is biased to the grounding potential, the control gate electrode 54 is biased to high potential $V_{PP}$ for programming. No potential is applied to the source electrode 52. At this time, since the expression of $C_{FD} \gg C_{FS}$, $C_{FB}$ and $C_{CF}$ exists, the potential of the floating gate 13 is biased substantially to the grounding potential as the same potential as the drain diffusion layer 11. On the other hand, the control gate electrode 54 is biased to the high potential $V_{PP}$. Therefore, a potential difference between the floating gate 13 and the control gate diffusion layer 14 becomes substantially equal to $V_{PP}$ to cause movement of electron from the floating gate 13 to the control gate diffusion layer 14 by the tunnel effect. Thus, the threshold voltage $V_{tm}$ of the memory cell is shifted to low voltage to memorize "1", for example.

On the other hand, upon erasing, as shown in the table 4, the drain electrode 51 is biased to the high potential $V_{PP}$ and the control gate electrode 54 is biased to the grounding potential. No potential is applied to the source electrode 52. Since the expression of $C_{FD} \gg C_{FS}$, $C_{FB}$ and $C_{CF}$ exists, the potential of the floating gate is biased substantially to $V_{PP}$. On the other hand, the control gate electrode 54 is biased to the grounding potential. Therefore, the potential difference between the floating gate 13 and the control gate diffusion layer 14 becomes substantially equal to $V_{PP}$. Thus, conversely to the case of writing, electron moves from the control gate diffusion layer 14 to the floating gate 13 by the tunnel effect to shift the threshold voltage $V_{tm}$ to high voltage to memorize "0", for example.

In the shown embodiment, since the floating gate 13 is completely covered with the protective gate 18, even when a quite large amount of mobile ion penetrates, the memorized data may not be destroyed. Also, when the insulation layer 20 is made thinner for improving efficiency of writing and erasing, since not only a part of the interlayer insulation layer 26 but also the isolation oxide layer 17 is formed between the n-type well 15 having the same potential as the control gate diffusion layer 14 and the protective gate 18, a current between the control gate diffusion layer 14 and the protective gate 18 capacitance the tunnel effect is prevented from flowing. Therefore, the efficiency of writing and erasing will never be lowered.

It should be noted that the protective gate electrode may be connected to have the same potential as the source electrode.

Figure 8A:
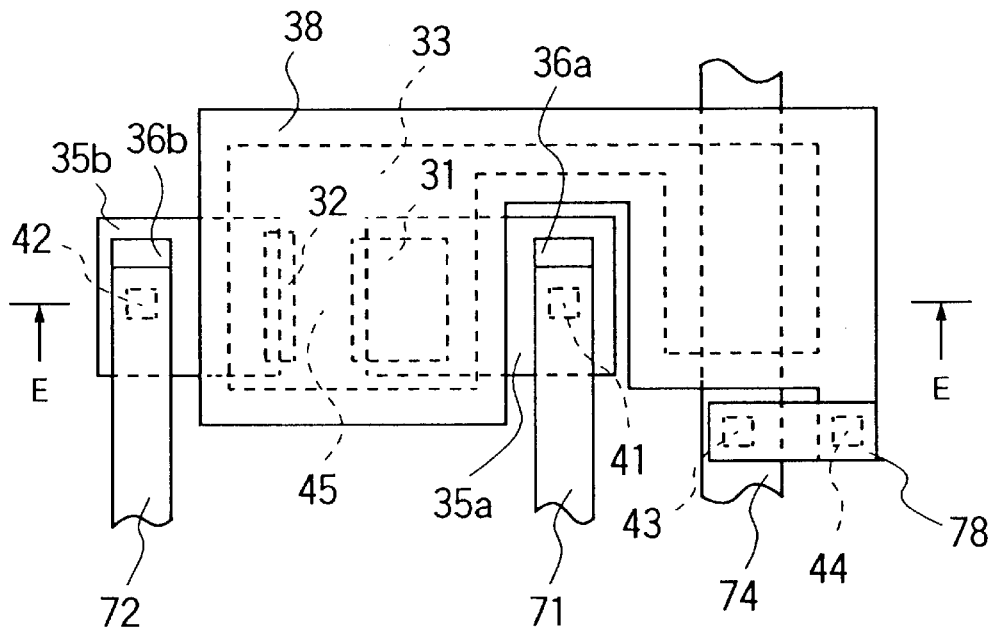
FIG. 8A is a plan view of the second embodiment of a read-only semiconductor memory device according to the present invention.
Figure 8B:
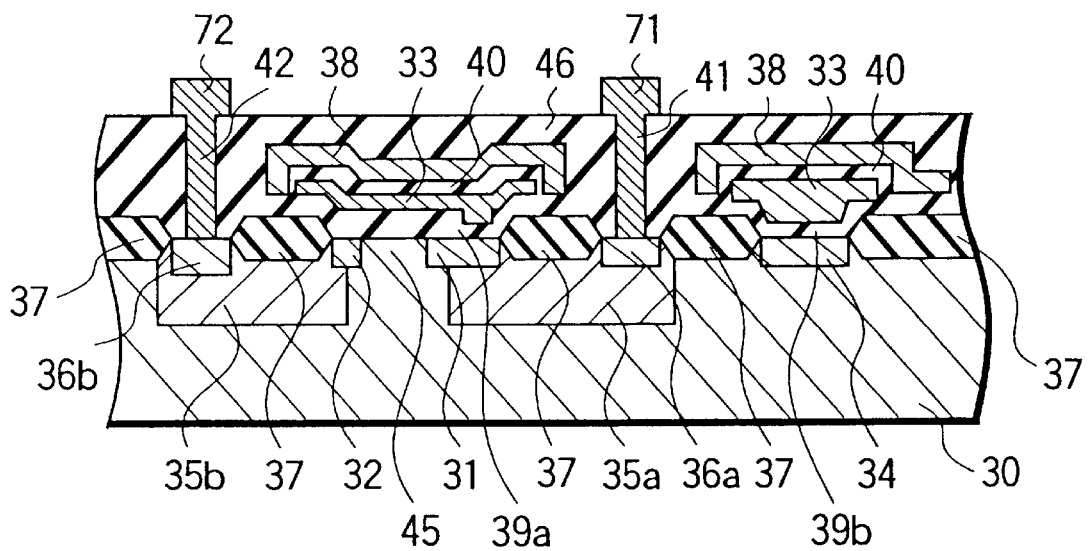
FIG. 8B is a section taken along line E—E in FIG. 8A.

Next, the second embodiment of the present invention will be discussed. FIG. 8A is a plan view of the second embodiment of a read-only semiconductor memory device according to the present invention, and FIG. 8B is a section taken along line E—E in FIG. 8A. It should be noted that an interlayer insulation layer and isolation oxide layer are neglected from illustration in FIG. 8A. In the shown embodiment, an n-type diffusion layer 36b, an n-type source diffusion layer 32, an n-type drain region 31, an n-type diffusion layer 36a and an n-type control gate diffusion layer 34 are stacked in alignment in sequential order on the surface of a p-type semiconductor substrate 30. A silicon substrate, for example, may be used as the semiconductor substrate 30. Also, a p-type channel region 45 is formed between the drain diffusion layer 31 and the source diffusion layer 32. An isolation oxide layer 37 is formed between the respective elements except for the channel region 45. A tunnel insulation layer 39a covering the drain diffusion layer 31, the source diffusion layer 32 and the channel region 45 and a tunnel insulation layer 39b covering a part of the control gate diffusion layer 34 and a part of the isolation oxide layer 37 adjacent thereto are formed. The tunnel insulation layers 39a and 39b are integrated with each other. A floating gate 33 is formed on the tunnel insulation layers 39a and 39b. The floating gate 33 is formed of polycrystalline silicon, for example. It should be noted that a distance between the floating gate 33 and a portion of the drain diffusion layer 31 is narrower than the distance between the floating gate 33 and the source diffusion layer 32.

The upper portion and the side portion of the floating gate 33 are covered with an insulation layer 40. The floating gate 33 is completely covered with a protective gate 38 of polycrystalline silicon via the insulation layer 40. Also, the respective elements formed on or above the surface of the semiconductor substrate 30 are covered with the interlayer insulation layer 46. Contact holes 41 to 44 reaching the n-type diffusion layer 36a or 36b, the control gate diffusion layer 34 or the protective gate 38 are provided through the interlayer insulation layer 46. Also, an n-type well 35a extending from the n-type diffusion layer 36a to the drain diffusion layer 31 through a portion of the semiconductor substrate 30 is formed. Similarly, an n-type well 35b extending from the n-type diffusion layer 36b to the source diffusion layer 32 through a portion of the semiconductor substrate 30 is formed. The drain diffusion layer 31 is connected to a drain electrode 71 of aluminum via the n-type well 35a, the n-type diffusion layer 36a and the contact hole 41. The source diffusion layer 32 is connected to a source electrode 72 of aluminum via the n-type well 35b, the n-type diffusion layer 36b and the contact hole 42. The protective gate 38 is connected to a protective gate electrode 78 via the contact hole 44. The control gate diffusion layer 34 per se serves as an electrode 74 for the control gate. The electrode 74 is connected to the protective gate electrode 78 via the contact hole 43.

In the shown embodiment, the protective gate 38 encloses the floating gate 33, and the end edge of the protective gate 38 opposes to the n-type wells 35a and 35b via a part of the interlayer insulation layer 46 and the isolation oxide layer 37.

Figure 9:
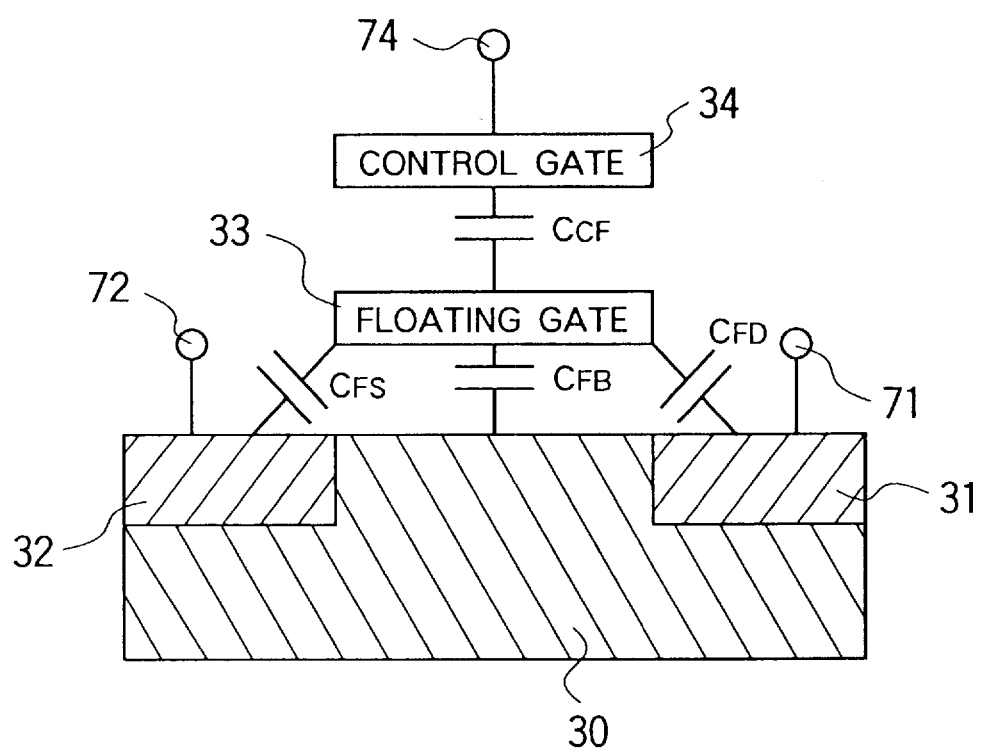
FIG. 9 is a diagrammatic illustration showing an equivalent circuit of the memory cell.

Next, operation of the foregoing semiconductor device set forth above will be discussed. FIG. 9 is an equivalent circuit of the memory cell. Some parasitic capacitance is present between the floating gate 33 and the drain diffusion layer 31, between the floating gate 33 and the source diffusion layer 32, between the floating gate 33 and the semiconductor substrate 30 and between the floating gate 33 and the control gate diffusion layer 34, respectively. Each parasitic capacitance is respectively assumed as $C_{FD}$, $C_{FS}$, $C_{FB}$ and $C_{CF}$ in sequential order. Also, a large parasitic capacitance is present between the floating gate 33 and the protective gate 38. Since the protective gate electrode 78 is connected to the electrode 74, it is included in $C_{CF}$. At this time, an expression of $C_{CF} \gg C_{FD}$, $C_{FS}$ and $C_{FB}$ exists.

The following table 5 shows potential to be applied to the memory cell upon writing or erasing.

TABLE 5

|  | DRAIN | SOURCE | CONTROL GATE |
|---|---|---|---|
| WRITING | $V_{PP}$ | — | GROUND |
| ERASING | GROUND | — | $V_{PP}$ |

Upon writing, as shown in foregoing table 5, the drain electrode 71 is biased to high potential $V_{PP}$ for programming, the 74 is biased to the grounding potential. No potential is applied to the source electrode 72. At this time, the potential $V_{FGw}$ of the floating gate 33 upon writing is expressed as the following equation (3)

$$V_{FGw} = (C_{FD}/(C_{FD}+C_{FS}+C_{FB}+C_{CF})) \times V_{PP} \quad (3)$$

Since the expression of $C_{CF} \gg C_{FD}$, $C_{FS}$ and $C_{FB}$ exists, upon writing, $V_{FGw}$ becomes substantially equal to 0 V. Therefore, a potential difference between the floating gate 33 and the drain diffusion layer 31 becomes substantially equal to $V_{PP}$ to cause movement of the electron from the floating gate 33 to the drain diffusion layer 31 by the tunnel effect. Thus, the threshold voltage $V_{tm}$ of the memory cell is shifted to low voltage to memorize "1", for example.

On the other hand, upon erasing, as shown in the table 5, the drain electrode 71 is biased to grounding potential, and the electrode 74 is biased to the high potential $V_{PP}$ for programming. No potential is applied to the source electrode 72. At this time, the potential $V_{FGe}$ of the floating gate 33 upon erasing is expressed as the following equation (4):

$$V_{FGe} = (C_{CF}/(C_{FD}+C_{FS}+C_{FB}+C_{CF})) \times V_{PP} \quad (4)$$

Since the expression of $C_{CF} \gg C_{FD}$, $C_{FS}$ and $C_{FB}$ exists, $V_{FGe}$ becomes substantially equal to $V_{PP}$. Therefore, the potential difference between the floating gate 33 and the drain diffusion layer 31 becomes substantially equal to $V_{PP}$. Thus, conversely to the case of writing, electron moves from the drain diffusion layer 31 to the floating gate 33 by the tunnel effect to shift the threshold voltage $V_{tm}$ to high voltage to memorize "0", for example.

In the shown embodiment, since the floating gate 33 is completely covered with the protective gate 38, even when a quite large amount of mobile ion penetrates, the memorized data may not be destroyed. Also, when the insulation layer 40 is made thinner for improving efficiency of writing and erasing, since not only a part of the interlayer insulation layer 46 but also the isolation oxide layer 37 is formed between the protective gate 38 and the n-type well 35a or 35b having the same potential as the drain diffusion layer 31 or the source diffusion layer 32, a current can be prevented from flowing. Therefore, the efficiency of writing and erasing will never be lowered.

Figure 10:
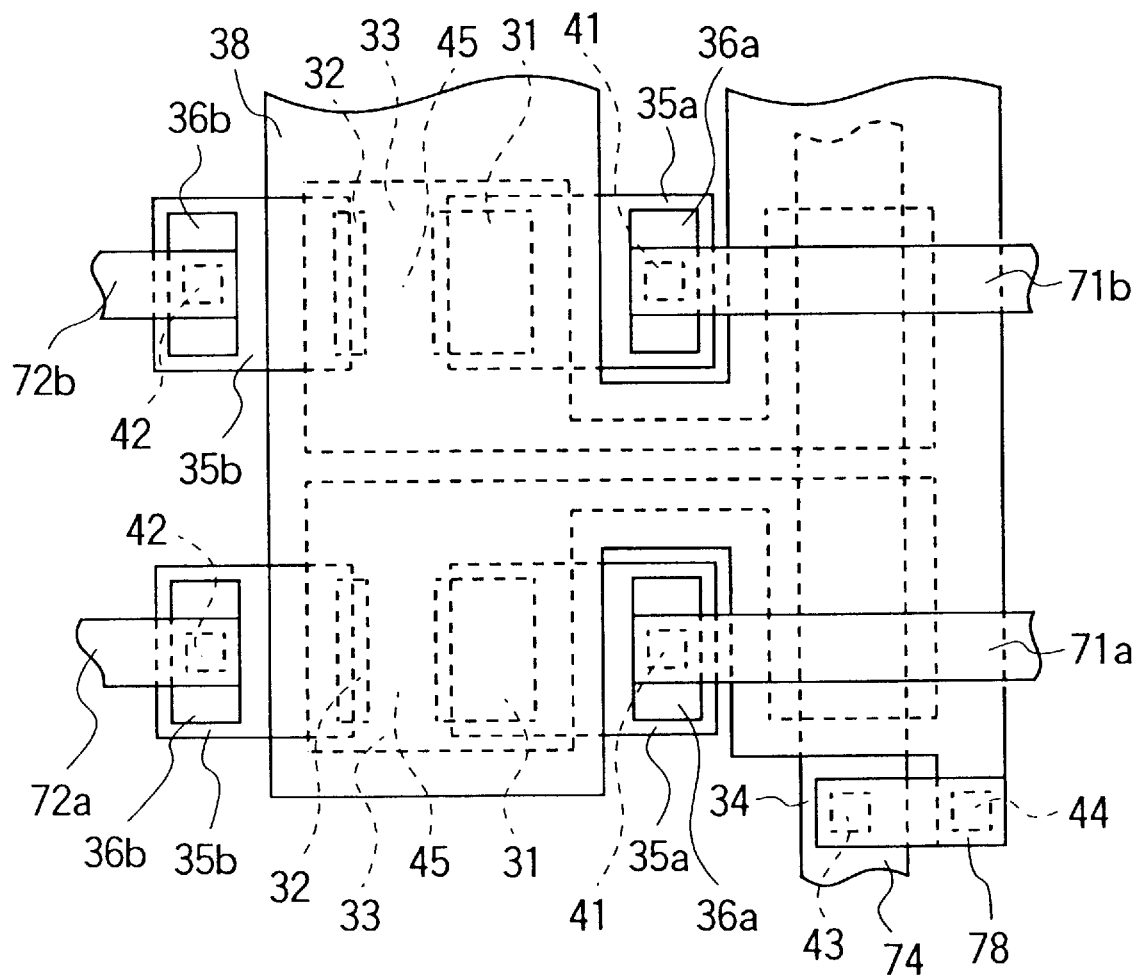
FIG. 10 is a plan view of the third embodiment of a read-only semiconductor memory device according to the present invention.

Next, the third embodiment of the present invention will be discussed. FIG. 10 is a plan view of the third embodiment of a read-only semiconductor memory device according to the present invention. It should be noted that an interlayer insulation layer and isolation oxide layer are neglected from illustration in FIG. 10. In the shown embodiment, two memory cells of the second embodiment are arranged. Since, the construction is the same as the second embodiment, the like elements to those in the former embodiment will be identified by like reference numerals and detailed description therefore will be neglected. In the shown embodiment, drain electrodes 71a and 71b and the source electrodes 72a and 72b are lead out from the respective memory cells. On the other hand, the control gate diffusion layer 34 and the protective gate 38 are common in two memory cells. Namely, the electrode 74 and the protective gate electrode 78 are common in two memory cells, and connected to each other.

In the shown embodiment, since the electrode 74 and the protective gate electrode 78 are common in a plurality of memory cells, it becomes unnecessary to provide regions for separating the electrode 74 and the protective gate electrode 78. Accordingly, a memory cell array having a plurality of memory cells arranged in small area can be constructed.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A read-only semiconductor memory device comprising:
   a first conductivity type semiconductor substrate;
   a second conductivity type drain diffusion layer selectively formed on the surface of said semiconductor substrate;
   a second conductivity type source diffusion layer selectively formed on the surface of said semiconductor substrate;
   a second conductivity type control gate diffusion layer selectively formed on the surface of said semiconductor substrate;
   a second conductivity type well connected to said control gate diffusion layer;
   a control gate electrode connected to said well;
   an isolation region formed between said control gate electrode and said control gate diffusion layer connected to said well;
   a floating gate formed above said drain diffusion layer, said source diffusion layer and said control gate diffusion layer;
   a first insulation layer insulating said floating gate from said drain diffusion layer, said source diffusion layer and said control gate diffusion layer;
   a protective gate covering said floating gate and having an end edge over said well and said isolation region; and
   a second insulation layer isolating said floating gate from said protective gate.

2. A read-only semiconductor memory device as set forth in claim 1, wherein said semiconductor substrate is of silicon.

3. A read-only semiconductor memory device as set forth in claim 1, wherein said protective gate and a second conductivity type diffusion layer selected from a group consisted of said drain diffusion layer and said source diffusion layer are connected to each other to have the same potential.

4. A read-only semiconductor memory device as set forth in claim 1, wherein said protective gate is in common with at least one memory cell formed in a common memory cell array.

5. A read-only semiconductor memory device as set forth in claim 1, wherein said control gate diffusion layer is in common with at least one memory cell formed in a common memory cell array.

6. A read-only semiconductor memory device as set forth in claim 1, wherein a distance between said floating gate and a portion of said drain diffusion layer is narrower than a distance between said floating gate and said source diffusion layer.

7. A read-only semiconductor memory device as set forth in claim 1, wherein said well and said electrode are connected to each other via a second conductivity type impurity diffusion layer.

8. A read-only semiconductor memory device as set forth in claim 1, wherein said protective gate is of polycrystalline silicon.

9. A read-only semiconductor memory device as set forth in claim 1, wherein said electrode is of aluminum.

10. A read-only semiconductor memory device as set forth in claim 1, wherein said floating gate is of polycrystalline silicon.

11. A read-only semiconductor memory device as set forth in claim 1, wherein said isolation region is of silicon oxide.

* * * * *